United States Patent
Zhai et al.

(10) Patent No.: US 7,100,812 B2
(45) Date of Patent: Sep. 5, 2006

(54) CAPILLARY HOLDER

(75) Inventors: Bao Nian Zhai, Singapore (SG); Ka Shing Kenny Kwan, Singapore (SG); Man Chan, Singapore (SG); Chi Po Chong, Tseung Kwan O (HK); Yam Mo Wong, Singapore (SG); Hing Leung Marchy Li, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 32 days.

(21) Appl. No.: 11/052,551

(22) Filed: Feb. 7, 2005

(65) Prior Publication Data

US 2006/0175377 A1    Aug. 10, 2006

(51) Int. Cl.
B23K 37/00     (2006.01)
B23K 31/00     (2006.01)
(52) U.S. Cl. ................... 228/1.1; 228/4.5; 228/180.5
(58) Field of Classification Search ................ None
See application file for complete search history.

(56) References Cited

U.S. PATENT DOCUMENTS

| | | | | |
|---|---|---|---|---|
| 5,944,249 | A | * | 8/1999 | Macabitas et al. ....... 228/180.5 |
| 6,135,338 | A | * | 10/2000 | Kyomasu et al. ............ 228/1.1 |
| 6,422,448 | B1 | * | 7/2002 | Kyomasu et al. ............ 228/1.1 |
| 6,918,528 | B1 | * | 7/2005 | Narasimalu et al. ....... 228/44.3 |

* cited by examiner

Primary Examiner—Lynne R. Edmondson
(74) Attorney, Agent, or Firm—Ostrolenk, Faber, Gerb & Soffen, LLP

(57) ABSTRACT

A capillary holder for mounting a capillary onto a horn is provided that comprises a mounting hole formed in the horn that has a first width along a first axis that is smaller than a width of the capillary and a second width along a second axis perpendicular to the first axis that is larger than the width of the capillary. In particular, the mounting hole is configured such that application of a flexion force to reduce the second width simultaneously expands the first width so as to fit the capillary when the first width is larger than the width of the capillary, and removal of said flexion force contracts the first width whereby to grip the capillary using an elastic force of the horn.

12 Claims, 4 Drawing Sheets

CAPILLARY HOLDER

FIELD OF THE INVENTION

The invention relates to an arrangement for mounting a capillary to a body of a bonding tool, such as a horn of an ultrasonic transducer for the purpose of performing wire bonding.

BACKGROUND AND PRIOR ART

Wire bonding is a common procedure used in semiconductor packaging whereby electrical wire connections are made between electrical contact pads of different electronic components, or of different contacts pads on an electronic component. For example, wire connections are commonly made between contact pads of an integrated circuit ("IC") chip and a lead frame carrier on which the IC chip is attached before the IC chip is molded during assembly.

A capillary is often used to apply bonding energy to weld bonding wire, typically made from gold, aluminum or copper, to the contact pads. The capillary is also used to feed wire to the contact pad and break the wire from the bond on the contact pad once a wire connection is made. Bonding energy, such as ultrasonic force, power and/or thermal energy is applied at a tip of the capillary. Therefore, it is very important for the capillary to be fastened securely so as to ensure that the wire bonds are formed properly and consistently according to set parameters.

Conventionally, a horn of an ultrasonic transducer is formed with a slit at its tip. The capillary is mounted in a recess in the slit. Threaded screw holes are made in the slit to receive a screw, which is screwed into the holes and tightened in order to close the slit and provided a clamping force to grip the capillary securely. However, it has been found that there are many disadvantages associated with the use of a screw to secure the capillary. One disadvantage is that since wire bonding is performed repeatedly at high frequency under stressful conditions, over time, the screw threads on the screw and screw holes become worn and loosen the screw. The problem is that wire bonding requirements are so precise that any loosening of the capillary mount may adversely affect the performance of the wire bonding tool. Another undesirable effect is the possible bending vibration caused by the screw.

One method of avoiding the aforesaid disadvantage is to utilize the body of the horn itself to grip the capillary without reliance on a foreign object to secure the capillary. This approach is disclosed in U.S. Pat. No. 6,422,448 entitled "Ultrasonic Horn for a Bonding Apparatus". An ultrasonic horn is provided with a capillary attachment hole formed so as to be smaller than the capillary and a jig insertion hole that communicates with the capillary attachment hole. A jig is insertable into the jig insertion hole to widen the capillary attachment hole. Therefore, a cross-sectional area of the capillary attachment hole is increase, so that the capillary can be received in the capillary attachment hole. The capillary is fastened in place by the elastic force that is generated by the horn material when the jig is removed from the jig insertion hole and the cross-sectional area of the capillary attachment hole is thereby reduced.

In typical ultrasonic transducers, the ultrasonic drivers are arranged such that ultrasonic oscillation is generated down the horn in a longitudinal direction along the length of the horn. A disadvantage of the gripping force introduced by the aforesaid prior art is that the elastic force is exerted on sides of the capillary that are transverse to the longitudinal oscillation axis of the horn. By gripping the capillary transversely to this longitudinal direction, the gripping force is less effective, and there is a greater risk of movement of the capillary in the longitudinal direction relative to the horn if the elastic fastening force is not sufficiently large to prevent this.

SUMMARY OF THE INVENTION

It is therefore an object of the invention to seek to provide an improved arrangement for fastening a capillary to a horn of a bonding tool without the use of screws to provide a clamping force on the capillary. It is related object of the invention in a preferred embodiment of the invention to seek to optimize a gripping force acting on the capillary in a direction of oscillation of the capillary.

Accordingly, the invention provides a capillary holder for mounting a capillary onto a horn, comprising a mounting hole formed in the horn that has a first width along a first axis that is smaller than a width of the capillary and a second width along a second axis perpendicular to the first axis that is larger than the width of the capillary, wherein the mounting hole is configured such that application of a flexion force to reduce the second width simultaneously expands the first width so as to fit the capillary when the first width is larger than the width of the capillary, and removal of said flexion force contracts the first width whereby to grip the capillary using an elastic force of the horn.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of preferred embodiments of capillary holders in accordance with the invention will now be described with reference to the accompanying drawings, in which.

DETAILED DESCRIPTION OF THE PREFERRED EMBODIMENTS

Figure 1:
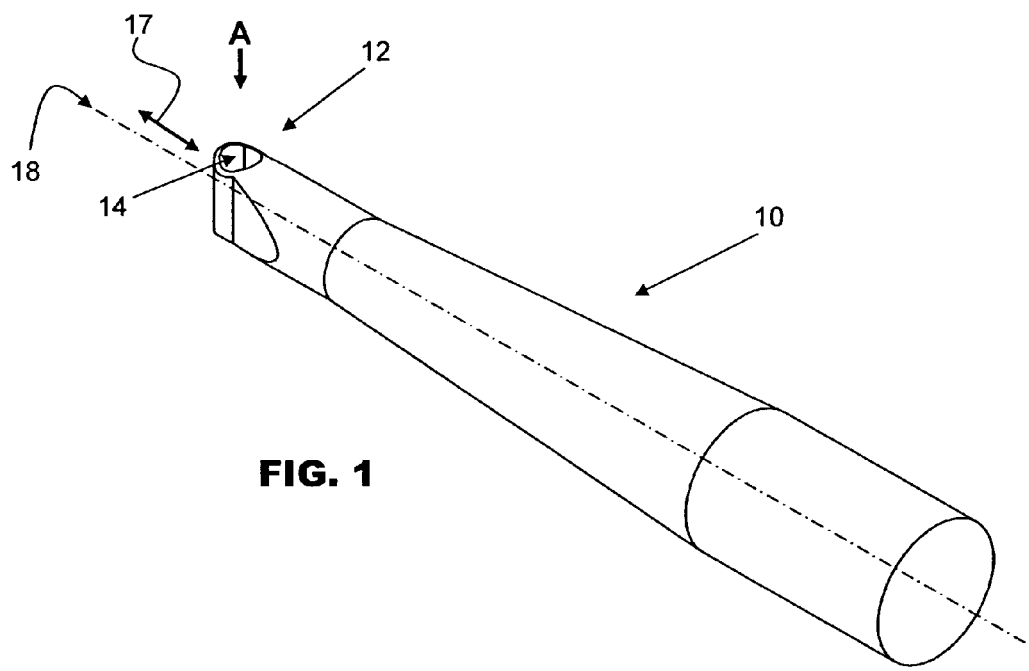
FIG. 1 is an isometric view of an ultrasonic horn including an arrangement for holding a capillary according to a first preferred embodiment of the invention.

FIG. 1 is an isometric view of an ultrasonic horn 10 including an arrangement for holding a capillary according to a first preferred embodiment of the invention. A mounting hole 14 is located at a tip 12 of the ultrasonic horn 10 for inserting and fastening a capillary. However, it should be appreciated that the mounting hole 14 can be located at other positions depending on the design and use of the horn. The horn 10 is connected to an ultrasonic driver (not shown) that is configured to generate ultrasonic oscillation along an oscillation axis 17 that is parallel to the longitudinal axis 18 of the horn 10.

Figure 2:
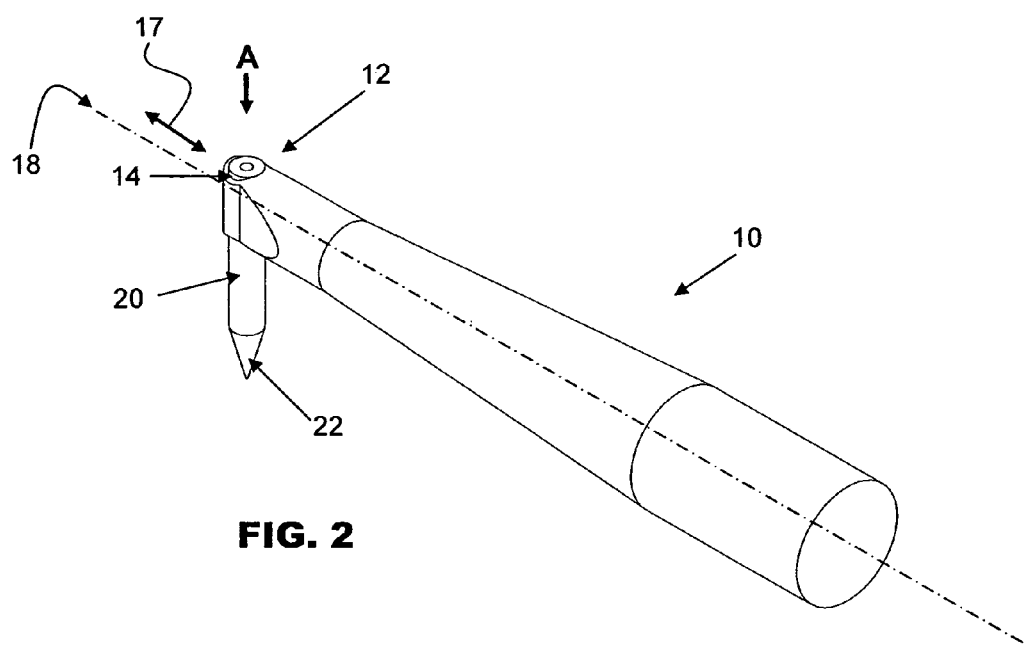
FIG. 2 is an isometric view of the ultrasonic horn of FIG. 1 including a capillary mounted onto it.

FIG. 2 is an isometric view of the ultrasonic horn 10 of FIG. 1 including a capillary 20 mounted onto it. Generally, a cross-sectional area of the mounting hole 14 is larger than a cross-sectional area of the capillary 20. The capillary 20 has a capillary tip 22 through which bonding wire is fed and bonding force and power is applied at the capillary tip 22. When the ultrasonic horn 10 is driven by ultrasonic drivers in use, the capillary 20 is driven to oscillate along the oscillation axis 17 that is parallel to the longitudinal axis 18 of the horn 10.

Figure 3:
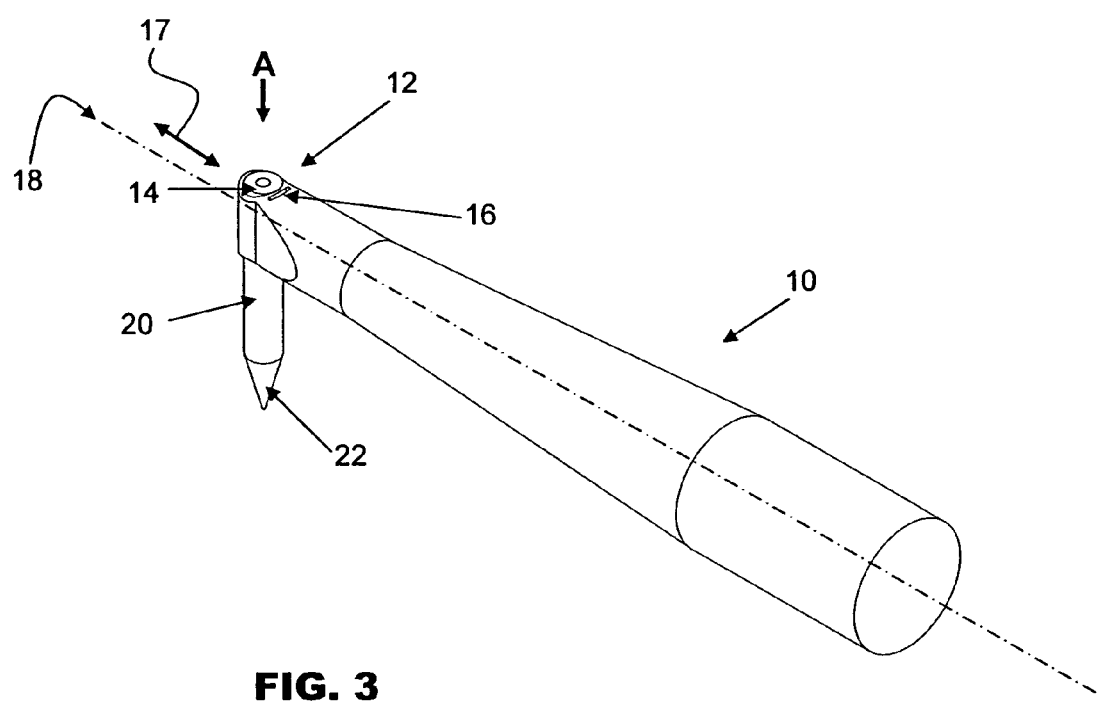
FIG. 3 is an isometric view of an ultrasonic horn according to a second preferred embodiment of the invention.

FIG. 3 is an isometric view of an ultrasonic horn according to a second preferred embodiment of the invention. In this embodiment, a slot 16 is located adjacent to the mounting hole 14, preferably opposite a distal end of the tip 12. It is aligned with the mounting hole 14 along a longitudinal axis 18 of the horn 10 and is divided from the mounting hole 14 by a portion of the horn 10. The slot 16 is positioned such that an edge of the mounting hole 14 next to the slot 16 is configured to flex in the direction of the slot 16 when a compression force is exerted on the sides of the tip 12 of the horn 10. An advantage of this design is that a portion of the periphery of the mounting hole 14 furthest from the tip of the horn 10 is allowed to flex and thus allow greater flexion to be achieved for the mounting hole 14 generally. In the first embodiment, this portion of the mounting hole 14 is relatively more rigid.

Figure 4A:
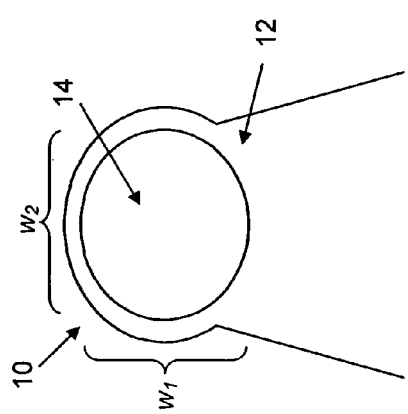
FIGS. 4a to 4c are plan views of the ultrasonic horn according to the first preferred embodiment looking from direction A of FIG. 1 and FIG. 2, illustrating the manner in which a tip of the ultrasonic horn can be manipulated to secure a capillary in a mounting hole.
Figure 4B:
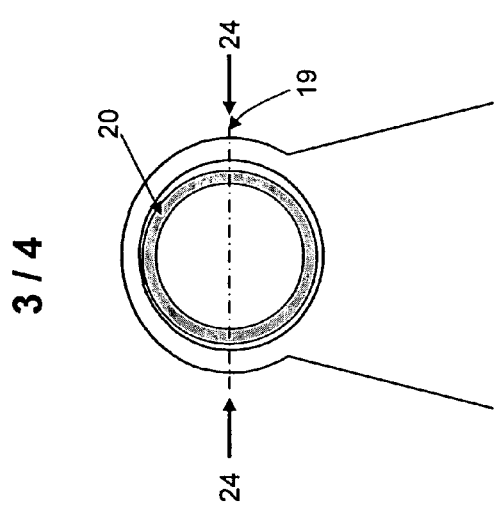
Figure 4C:
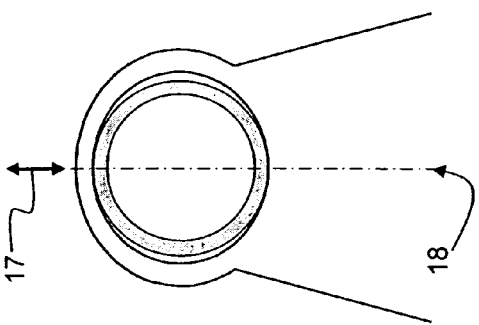

FIGS. 4a to 4c are plan views of the ultrasonic horn 10 according to the first preferred embodiment looking from direction A of FIG. 1 and FIG. 2, illustrating the manner in which a tip 12 of the ultrasonic horn 10 can be manipulated to secure a capillary 20 in the mounting hole 14. In FIG. 4a, there is no force acting on the tip 12 of the horn 10, and the mounting hole 14 is generally in an elliptical shape at rest. The cross-sectional area of the mounting hole 14 is larger than the cross-sectional area of the capillary 20. The elliptical mounting hole 14 comprises two primary widths. A first width, $w_1$, of such ellipse that lies along a first axis or longitudinal axis 18 of the horn 10 is smaller than a width of the capillary 20. A second width, $w_2$, of the mounting hole 14 along a second axis 19 perpendicular to the first or longitudinal axis 18 is larger than the width of the capillary 20. This ensures that the capillary 20 is gripped at points along the first or longitudinal axis 18 of the horn 10 when the capillary 20 is inserted and fastened. Additionally, the capillary 20 cannot be inserted into the mounting hole 14 without the application of a flexion force on the sides of the horn tip 12 (as described below) to flex the edges of the mounting hole 14 so as to increase the width of the mounting hole 14 along the longitudinal axis.

In FIG. 4b, flexion forces in the form of compression forces 24 that are parallel to the second axis are exerted on the sides of the horn tip 12 to flex the edges of the mounting hole 14 along the longitudinal axis 18 of the horn 10. The second width of the mounting hole 14 is reduced while simultaneously, the first width of the mounting hole 14 along the longitudinal axis 18 is expanded. The change in the shape of the mounting hole 14 makes it possible to insert a capillary 20 once the first width is larger than the width of the capillary 20. Unlike in the prior art, it would be noted that the cross-sectional area of the mounting hole 14 before application of the flexion or compression forces 24 is substantially the same as the cross-sectional area of the mounting hole 14 during application of the forces.

The compression forces 24 may be provided in a variety of ways, such as simply by using a pair of pliers to compress the sides of the horn tip 12. Accordingly, a special tool is not necessary for mounting the capillary 20. However, a jig with a clamp that is controllable to compress the horn tip 12 by a predetermined distance is preferable to achieve consistency in the distance or amount of compression to be applied. When the edges of the mounting hole 14 are sufficiently flexed to fit the capillary 20, the capillary 20 is inserted.

In FIG. 4c, once the capillary 20 is properly positioned, the compression forces 24 are removed. The edges of the mounting hole 14 will tend to return to their original unflexed positions, thereby contracting the first width of the mounting hole 14 along the longitudinal axis 18. A gripping force is thereby exerted on the capillary 20 by the elastic force of the horn material tending to return the mounting hole 14 to its original shape, and the capillary 20 is mounted and secured. In particular, the two gripping positions of the mounting hole 14 on the capillary 20 are located along and substantially apply gripping forces that are parallel to the oscillation axis 17 or longitudinal axis 18 of the horn 10. Therefore, the capillary 20 is more effectively secured along its oscillation direction parallel to the longitudinal axis 18 of the horn 10.

Figure 5A:
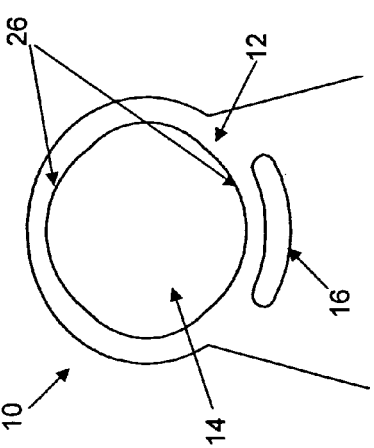
FIGS. 5a to 5c are plan views of an ultrasonic horn according to the second preferred embodiment of the invention looking from direction A of FIG. 3 including recesses formed in the mounting hole that are shaped to receive a capillary.
Figure 5B:
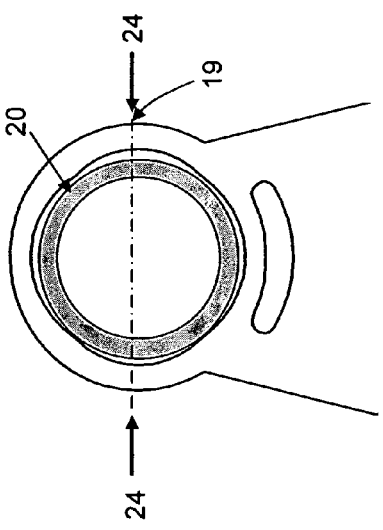
Figure 5C:
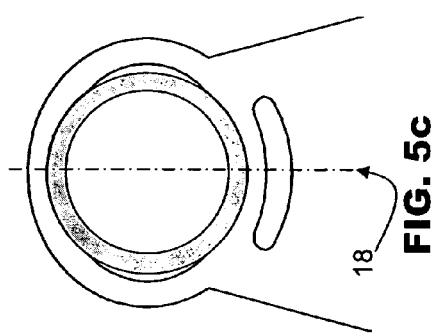

FIGS. 5a to 5c are plan views of an ultrasonic horn 10 according to the second preferred embodiment of the invention looking from direction A of FIG. 3 including recesses 26 formed in the mounting hole 14 that are shaped to receive a capillary 20. In FIG. 5a, there is no force acting on the tip 12 of the horn 10, and the mounting hole 14 is generally in an elliptical shape at rest, as in the first embodiment. Additionally, the mounting hole 14 includes two recesses 26 aligned along the longitudinal axis 18 of the horn 10 that are shaped in conformance with a portion of a circumference of the capillary 20. The recesses 26 are formed to receive the capillary 20 and may enable the mounting hole 14 to more readily receive the capillary 20 upon the application of the compression forces 24.

In FIG. 5b, compression forces 24 are exerted on the sides of the tip 12 of the horn 10 to flex the edges of the mounting hole 14 along the longitudinal axis 18 of the horn 10. Once the edges of the mounting hole 14 along the longitudinal axis 18 are sufficiently flexed to fit the capillary 20, the capillary 20 is inserted and positioned.

In FIG. 5c, the capillary 20 has been properly positioned and the compression forces 24 are removed. Since the recesses 26 are shaped according to a portion of the circumference of the capillary 20, the capillary 20 fits more snugly in the mounting hole 14.

Figure 6C:
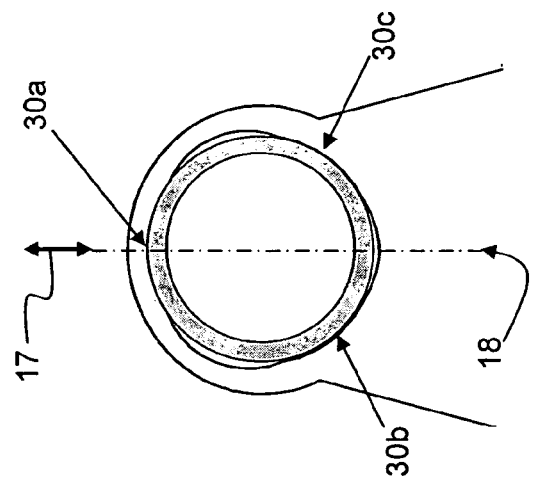
FIGS. 6a to 6c are plan views of an ultrasonic horn according to a third preferred embodiment of the invention, wherein the mounting hole includes three gripping positions to grip a capillary.
Figure 6B:
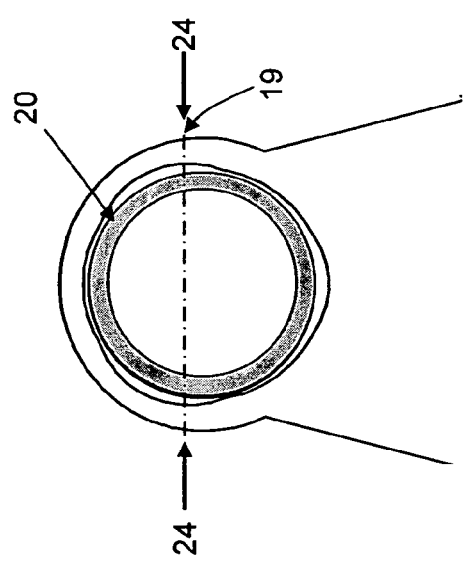
Figure 6A:
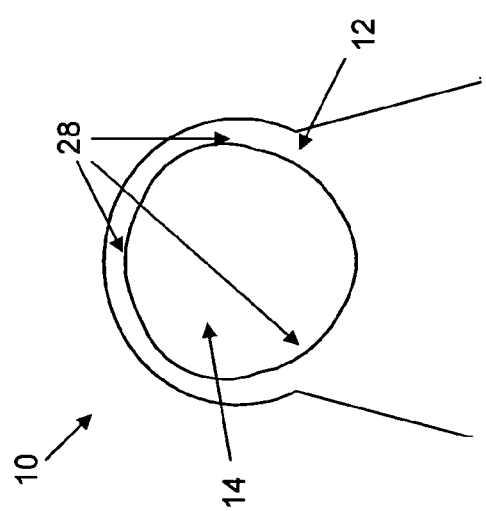

FIGS. 6a to 6c are plan views of an ultrasonic horn 10 according to a third preferred embodiment of the invention, wherein the mounting hole 14 includes three gripping positions 30a, 30b, 30c for gripping the capillary 20. In FIG. 6a, the mounting hole 14 is at an unflexed position. Three recesses 28 are formed in the mounting hole 14 in between the three gripping positions 30a, 30b, 30c.

In FIG. 6b, when compression forces 24 are applied to the tip 12 of the horn 10 adjacent to the mounting hole 14, an edge of the mounting hole 14 at a distal end of the horn 10 is allowed to flex to expand the mounting hole 14. The compression forces 24 are applied on the horn tip 12 along the second axis 19 such that the first width of the mounting hole 14 along the longitudinal axis 18 of the horn 10 is expanded to allow a capillary 20 to be inserted. Once the width of the mounting hole 14 along the longitudinal axis is large enough to accommodate a capillary, a capillary 20 is inserted into position.

In FIG. 6c, the capillary 20 has been positioned and the compression forces 24 are removed. In this embodiment, the recesses 28 are preferably formed such that the mounting hole 14 grips the capillary 20 at three gripping positions 30a, 30b, 30c around the circumference of the capillary 20. The arrangement of the gripping positions may be generally triangular. In particular, at least one gripping position 30a preferably lies along the longitudinal axis 18 of the horn 10. The other gripping positions 30b, 30c should preferably also act on the capillary 20 in such a way that they provide gripping forces that comprise force components that are parallel to the oscillation axis 17. In this way, the capillary 20 is gripped securely along the oscillation axis 17 as the gripping positions 30a, 30b, 30c are still arranged to substantially apply forces that are parallel to the oscillation axis 17 or longitudinal axis 18.

At least a portion of the horn 10 at which the mounting hole 14 is formed is preferably made from titanium. Therefore, the horn 10 could be manufactured from one single piece of material that is made from titanium, or it could comprise two or more pieces that are connected together. In the latter case, it is preferred that the piece of material at which the mounting hole 14 is formed is made from titanium.

It would be appreciated that since there is no need to use screws to provide clamping forces for mounting the capillary in the above preferred embodiments of the invention, a purer longitudinal oscillation or vibration of the capillary can be achieved and conventional problems relating to the screws wearing off can be avoided. A simpler design is possible such that ultrasonic properties of the bonding tool can be made more consistent. The simpler design also results in easier manufacturability and quality control.

Another advantage of the capillary holders according to the preferred embodiments of the invention is that the capillary is held by a direct compressive force, not by a frictional force as in conventional bonding tools using screws. As a result, a lesser clamping force to the capillary is required and there is less wear on the mounting hole of the horn. Further, by gripping the capillary at points along the longitudinal axis of the horn, the capillary can be held more securely during longitudinal vibration of the capillary when ultrasonic bonding is carried out.

The invention described herein is susceptible to variations, modifications and/or additions other than those specifically described and it is to be understood that the invention includes all such variations, modifications and/or additions which fall within the spirit and scope of the above description.

The invention claimed is:

1. A capillary holder for mounting a capillary onto a horn, comprising the capillary holder including
    a mounting hole formed in the horn, the mounting hole has a first width along a first axis that is smaller than a width of the capillary and has a second width along a second axis perpendicular to the first axis that is larger than the width of the capillary,
    wherein the horn is of such material with such elasticity and the mounting hole is configured such that application of a flexion force to the horn to reduce the second width simultaneously expands the first width so as to fit the capillary when the first width is larger than the width of the capillary, and removal of the flexion force contracts the first width whereby to grip the capillary using an elastic force of the horn.

2. The capillary holder as claimed in claim 1, wherein the horn is driven to oscillate along an oscillation axis in use and the first axis is parallel to said oscillation axis.

3. The capillary holder as claimed in claim 1, wherein the flexion force comprises one or more compression forces acting on the horn that are parallel to the second axis.

4. The capillary holder as claimed in claim 1, wherein a cross-sectional area of the mounting hole is greater than a cross-sectional area of the capillary.

5. The capillary holder as claimed in claim 4, wherein the material of the horn is such that the cross-sectional area of the mounting hole before application of the flexion force is substantially the same as the cross-sectional area of the mounting hole during application of the flexion force.

6. The capillary holder as claimed in claim 1, including recesses formed in the mounting hole that are shaped in conformance with a circumference of the capillary.

7. The capillary holder as claimed in claim 1, including at least two gripping positions formed in the mounting hole such that each gripping position is adapted to apply a force that is parallel to the first axis for gripping the capillary.

8. The capillary holder as claimed in claim 7, wherein the mounting hole comprises three gripping positions for gripping the capillary.

9. The capillary holder as claimed in claim 1, including a slot formed in the horn adjacent to the mounting hole and that is divided from the mounting hole by a portion of the horn and is aligned with the mounting hole along the first axis.

10. The capillary holder as claimed in claim 1, wherein the mounting hole is elliptical in shape.

11. The capillary holder as claimed in claim 1, wherein at least a portion of the horn at which the mounting hole is formed is made from titanium.

12. The capillary holder as claimed in claim 1, wherein a cross-sectional area of the mounting hole before application of the flexion force is substantially the same as a cross-sectional area of the mounting hole during application of the flexion force.

* * * * *